(12) United States Patent
Aoki et al.

(10) Patent No.: US 9,696,094 B2
(45) Date of Patent: Jul. 4, 2017

(54) COOLING UNIT

(75) Inventors: Michimasa Aoki, Kawasaki (JP);
Masumi Suzuki, Kawasaki (JP);
Yosuke Tsunoda, Tachikawa (JP);
Masaru Sugie, Hino (JP); Shinichirou Kouno, Machida (JP); Kenji Katsumata, Odawara (JP); Wataru Nishiyama, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 410 days.

(21) Appl. No.: 13/425,476

(22) Filed: Mar. 21, 2012

(65) Prior Publication Data

US 2012/0241137 A1 Sep. 27, 2012

(30) Foreign Application Priority Data

Mar. 25, 2011 (JP) .................................. 2011-066919

(51) Int. Cl.
*F28D 1/047* (2006.01)
*H05K 7/20* (2006.01)
*F28F 9/02* (2006.01)
*F28D 21/00* (2006.01)
*H01L 23/473* (2006.01)

(52) U.S. Cl.
CPC .......... *F28D 1/0476* (2013.01); *F28F 9/0214* (2013.01); *H05K 7/20772* (2013.01); *F28D 2021/0031* (2013.01); *H01L 23/473* (2013.01); *H01L 2924/0002* (2013.01)

(58) Field of Classification Search
CPC F28D 1/0476; F28D 2021/0031; F28F 9/012; F28F 9/0214; F28F 9/0231; F28F 9/0246; H01L 23/467; H01L 23/473

USPC .................................. 165/104.27, 174, 176
See application file for complete search history.

(56) References Cited

U.S. PATENT DOCUMENTS

| 4,491,174 A * | 1/1985 | Villeval .................... 165/104.32 |
| 7,113,404 B2 * | 9/2006 | Naganawa et al. ........... 361/699 |
| 7,694,528 B2 * | 4/2010 | Nishida et al. ................ 165/172 |
| 2006/0067052 A1 * | 3/2006 | Llapitan ................ H01L 23/473 361/700 |
| 2006/0131009 A1 * | 6/2006 | Nies .............................. 165/176 |

FOREIGN PATENT DOCUMENTS

| JP | 09-205167 A | 8/1997 |
| JP | 11-204708 A | 7/1999 |
| JP | 2004-319628 A | 11/2004 |
| JP | 2010-010195 A | 1/2010 |

* cited by examiner

*Primary Examiner* — Len Tran
*Assistant Examiner* — Hans Weiland
(74) *Attorney, Agent, or Firm* — Squire Patton Boggs (US) LLP (57) ABSTRACT

A cooling unit includes a tank having an inlet port and a discharge port for refrigerant, first and second radiators connected to the tank, the first and second radiators each having a flow path, an inlet chamber defined in the tank for supplying the refrigerant flowing therein from the inlet port to the first radiator, a discharge chamber defined in the tank for discharging the refrigerant cooled in the second radiator to the discharge port, and a reservoir in which bubbles generated in the refrigerant are collected, the reservoir being provided between the inlet chamber and the discharge chamber in the tank.

4 Claims, 7 Drawing Sheets

COOLING UNIT

CROSS-REFERENCE TO RELATED APPLICATION

This application is based upon and claims the benefit of priority from the prior Japanese Patent Application No. 2011-66919 filed on Mar. 25, 2011, the entire contents of which are incorporated herein by reference.

FIELD

The embodiments disclosed herein are relates to a cooling unit for cooling an electronic component mounted on an electronic device with refrigerant.

BACKGROUND

In recent years, PC servers and UNIX servers of rack-mounting type, in which a plurality of server modules are stacked in layers on a rack cabinet, are the mainstream. At least one integrated circuit element (LSI), such as a central processing unit (CPU), is mounted on each server module. In a single server and a personal computer, a fan is provided immediately above a component that generates a large amount of heat, such as a CPU or an LSI, to cool the component with air, achieving stable operation. However, in rack-mounting type servers, in order to realize high performance and compact configuration, as many server modules as possible have to be stacked on a single rack cabinet. Because the thickness of the server modules has to be reduced, in server modules of rack-mounting type, it is difficult to directly attach a fan to a component that generates a large amount of heat, such as a CPU or an LSI. Furthermore, because the server modules are stacked, it is difficult to release heat in the server modules to the outside. To solve these problems, there have been proposed means for cooling CPUs and LSIs, in which refrigerant is circulated on heat-generating components, such as CPUs and LSIs, to cool these components, and the refrigerant having absorbed heat from the CPUs and the LSIs is circulated with a pump to a radiator to be cooled with a cooling fan.

The following is reference document.

[Document 1] Japanese Laid-open Patent Publication No. 2004-319628

SUMMARY

According to an aspect of the embodiment, a cooling unit includes a tank having an inlet port and a discharge port for refrigerant, first and second radiators connected to the tank, the first and second radiators each having a flow path, an inlet chamber defined in the tank for supplying the refrigerant flowing therein from the inlet port to the first radiator, a discharge chamber defined in the tank for discharging the refrigerant cooled in the second radiator to the discharge port, and a reservoir in which bubbles generated in the refrigerant are collected, the reservoir being provided between the inlet chamber and the discharge chamber in the tank.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Referring to the drawings, preferred embodiments of the technique disclosed herein will be described in detail below.

Figure 1:
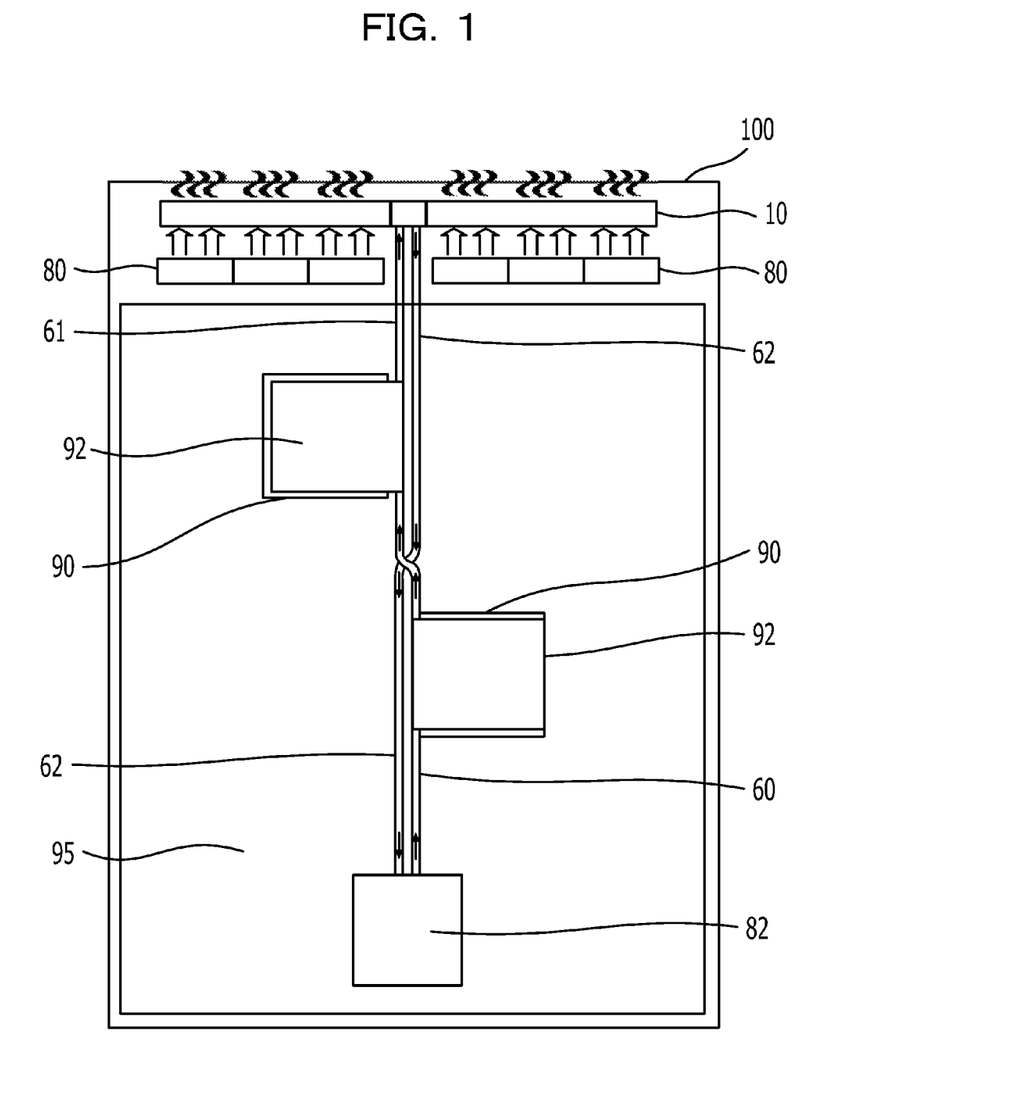
FIG. 1 illustrates the structure of a server module utilizing a cooling unit.

FIG. 1 illustrates an inner configuration of a server module utilizing a cooling unit that employs the technique disclosed herein. A server module 100 accommodates a circuit substrate 95, on which a plurality of CPUs 90 are mounted. Cooling jackets 92 are attached to the CPUs 90 to conduct heat from the CPUs 90 to refrigerant. The cooling jackets 92 are made of a heat-conducting metal, such as copper or aluminum.

A cooling unit 10 is disposed at an end (upper end in FIG. 1) in the server module 100, and a plurality of fans 80 are disposed on the inner side of the cooling unit 10. The plurality of fans 80 are rotated such that they blow air toward the cooling unit 10. The air heated by the cooling unit 10 is discharged outside the server module 100 from an end of the server module 100.

Because servers are usually placed in temperature-controlled rooms, the cooling effect may be obtained by reversing the rotation direction of the fans 80 to introduce outside air from an end of the server module 100 to cool the cooling unit 10 with the outside air.

A pump 82 is disposed in the server module 100, and the refrigerant whose pressure is increased by the pump 82 is supplied to a pipe 60. The refrigerant absorbs the heat of the CPUs 90 via the cooling jackets 92 and is supplied to the cooling unit 10 through a pipe 61. The refrigerant is cooled in the cooling unit 10 by the fans 80 and is returned to the pump 82 through a pipe 62.

The pump 82, the pipe 60, the cooling jackets 92, the pipe 61, the cooling unit 10, and the pipe 62 form a heat-release circulation loop, through which the refrigerant circulates. By disposing the heat-release circulation loop in a straight-line configuration and reducing the length of the path, the refrigerant may be circulated at a high flow rate, thereby improving the heat-releasing efficiency. Because the circuit substrate 95 is designed with a focus on the CPUs 90, which are the main parts of the circuit, the CPUs 90 are often disposed at the center of the circuit substrate 95. Accordingly, the heat-release circulation loop is also often disposed so as to cross the center of the circuit substrate 95.

Although propylene glycol antifreeze may be used as the refrigerant, the refrigerant is not limited thereto. Some parts of the pipes 60, 61, and 62 are made of a heat-insulating flexible material, such as rubber or resin, and some parts, e.g., portions near the cooling jackets 92, are made of a heat-conducting material, such as metal, so that the heat from the CPUs 90 may be efficiently conducted to the refrigerant.

Figure 2A:
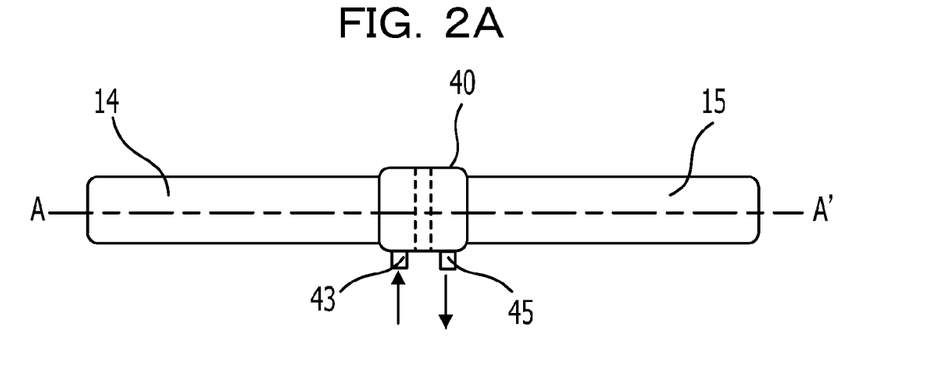
FIGS. 2A to 2C illustrate a cooling unit according to a first embodiment.

Next, with reference to FIGS. 2A to 2C, the cooling unit 10 according to the first embodiment will be described. FIG. 2A is a top view of the cooling unit 10. The cooling unit 10 includes a tank 40 disposed at the center and radiators 14 and 15 disposed on the left and right sides of the tank 40. The tank 40 has, in a side surface thereof, an inlet port 43, to which the pipe 61 is connected and from which the refrigerant having absorbed the heat of the CPUs 90 via the cooling jackets 92 flows into the cooling unit 10, and a discharge port 45, to which the pipe 62 is connected and from which the refrigerant having cooled in the cooling unit 10 is discharged. The tank 40 not only circulates the refrigerant flowing therein from the inlet port 43 through the left and right radiators 14 and 15, but also stores the refrigerant in the heat-release circulation loop.

Figure 2B:
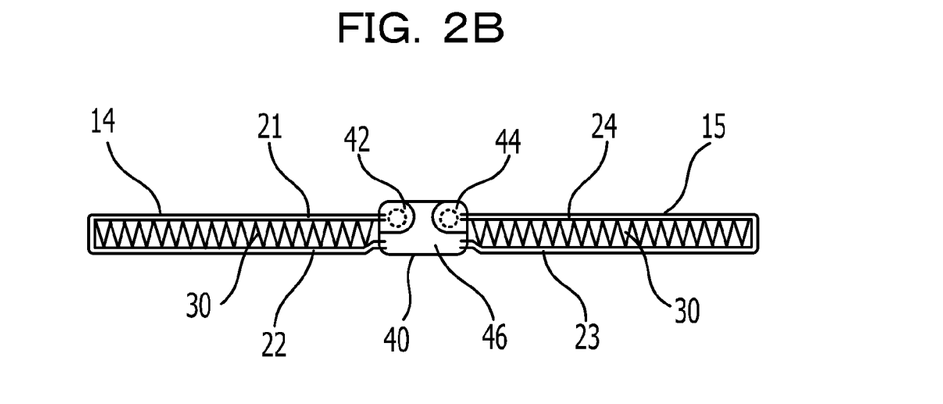

FIG. 2B is a cross-sectional view taken along line A-A' in FIG. 2A. The inside of the tank 40 is divided into an inlet chamber 42 on the upper left side in FIG. 2B, communicating with the inlet port 43, a discharge chamber 44 on the upper right side in FIG. 2B, communicating with the discharge port 45, and a reservoir 46 for storing the refrigerant.

The radiator 14 has the shape of a flat tube being bent and includes flow paths 21 and 22 through which refrigerant flows. In FIG. 2B, the flow path 21 is bent at the left end and communicates with the flow path 22. A radiation plate 30 folded in a bellows shape is provided between the flow path 21 and the flow path 22. Similarly, the radiator 15 has the shape of a flat tube being bent and includes flow paths 23 and 24 through which refrigerant flows. In FIG. 2B, the flow path 23 is bent at the right end and communicates with the flow path 24. A radiation plate 30 folded in a bellows shape is provided between the flow path 23 and the flow path 24.

Figure 2C:
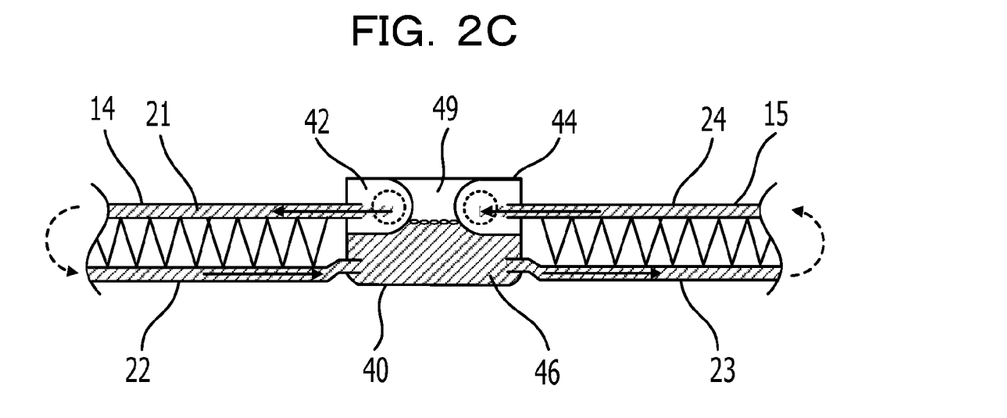

FIG. 2C illustrates the cooling operation of the cooling unit 10. The refrigerant heated by absorbing the heat of the CPUs 90 via the cooling jackets 92 flows into the inlet chamber 42 through the inlet port 43. The heated refrigerant is discharged from the inlet chamber 42 into the flow path 21 of the radiator 14 on the left side in FIG. 2C. The heat of the refrigerant flowing through the flow path 21 is conducted to the radiation plate 30, whereby the temperature of the refrigerant decreases. The radiation plate 30 is cooled by the fans 80. The heat of the refrigerant flowing through the flow path 21 is also released from the upper surface of the flow path 21. The refrigerant flowing through the flow path 21 turns at the end of the flow path 21 and flows back through the flow path 22. The heat of the refrigerant flowing through the flow path 22 is conducted again to the radiation plate 30, whereby the temperature of the refrigerant further decreases. The refrigerant flowing through the flow path 22 enters the reservoir 46 in the tank 40.

In addition to the refrigerant flowing through the heat-release circulation loop, the reservoir 46 stores refrigerant for compensating for a decrease in the amount of refrigerant flowing through the heat-release circulation loop due to permeation of the refrigerant through the rubber used in the pipes and the resin surface used in the pump.

The refrigerant flowing into the reservoir 46 is supplied to the flow path 23 of the radiator 15 on the right side in FIG. 2C. The heat of the refrigerant flowing through the flow path 23 is conducted to the radiation plate 30, whereby the temperature of the refrigerant further decreases. The radiation plate 30 is cooled by the fans 80. The refrigerant flowing through the flow path 23 turns at the end of the flow path 23 and flows back through the flow path 24. The heat of the refrigerant flowing through the flow path 24 is conducted again to the radiation plate 30, whereby the temperature of the refrigerant further decreases. The heat of the refrigerant flowing through the flow path 24 is released also from the upper surface of the flow path 24. The refrigerant flowing through the flow path 24 flows into the discharge chamber 44 in the tank 40. The refrigerant flowing into the discharge chamber 44 is discharged from the discharge port 45 into the pipe 62 and is returned to the pump 82 through the pipe 62.

In this manner, the refrigerant heated by the CPUs 90 is gradually cooled in the flow paths 21, 22, 23, and 24 of the cooling unit 10, and the cooled refrigerant is returned to the pump 82 and is then supplied back by the pump 82 to absorb the heat of the CPUs 90.

In the tank 40, the reservoir 46 occupies a region beneath and between the inlet chamber 42 and the discharge chamber 44. When the server module 100 is fabricated, the heat-release circulation loop is filled with the refrigerant as much as possible. The region between the inlet chamber 42 and the discharge chamber 44 in the reservoir 46 is also filled with the refrigerant. Filling the refrigerant is usually performed under normal temperature. At this time, air is dissolved in the refrigerant.

When the server module 100 is activated to start cooling the CPUs 90, the temperature of the refrigerant increases. As a result, the air dissolved in the refrigerant under normal temperature becomes bubbles. The bubbles generated in the heat-release circulation loop move along the refrigerant flow and enter the reservoir 46 in the tank 40. Because the bubbles have less specific gravity than the refrigerant, the bubbles are accumulated in the upper region in the reservoir 46, between the inlet chamber 42 and the discharge chamber 44. The bubbles once accumulated in the region between the inlet chamber 42 and the discharge chamber 44 are not discharged into the flow path 23 of the right-side radiator 15 and form an air layer 49. Because the air layer 49 is positioned in the upper region of the reservoir 46, the air layer 49 does not block the flow of the refrigerant flowing from the radiator 14 and to the radiator 15 through the reservoir 46. Because the bubbles generated in the heat-release circulation loop are eventually collected in the reservoir 46 like this, the flow of the refrigerant in the heat-release circulation loop may be prevented from being blocked by the bubbles.

In the tank 40, because the inlet chamber 42 and the discharge chamber 44 are disposed at a distance from each other, the heat of the refrigerant heated by the CPUs 90 and flowing into the inlet chamber 42 may be prevented from being conducted to the refrigerant cooled by the radiator 15 in the discharge chamber 44. Because the air layer 49 serving as a heat insulating layer is formed between the inlet chamber 42 and the discharge chamber 44, the heat of the refrigerant cooled by the radiator 14 may be prevented from being conducted to the refrigerant further cooled by the radiator 15. Thus, the cooling efficiency is improved.

Figure 3A:
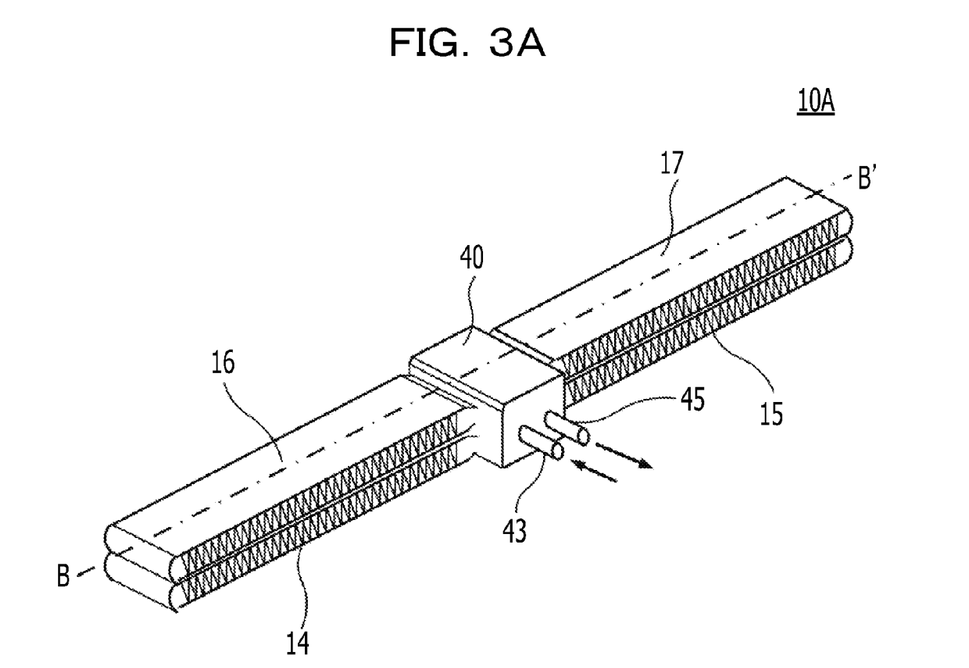
FIGS. 3A and 3B illustrate a cooling unit according to a second embodiment.

Next, with reference to FIGS. 3A and 3B, a cooling unit 10A according to a second embodiment will be described. FIG. 3A is a perspective view of the cooling unit 10A. Compared with the cooling unit 10 according to the first embodiment, the cooling unit 10A includes the tank 40 and radiators 16 and 17 disposed on the left and right sides of the tank 40. By adding the radiators 16 and 17 on the left and right sides of the tank 40, the cooling efficiency of the refrigerant is improved. The tank 40 has, in a side surface thereof, an inlet port 43, to which the pipe 61 is connected and from which the refrigerant having absorbed the heat of the CPUs 90 via the cooling jackets 92 flows into the cooling unit 10, and a discharge port 45, to which the pipe 62 is connected and from which the refrigerant having cooled in the cooling unit 10 is discharged.

Figure 3B:
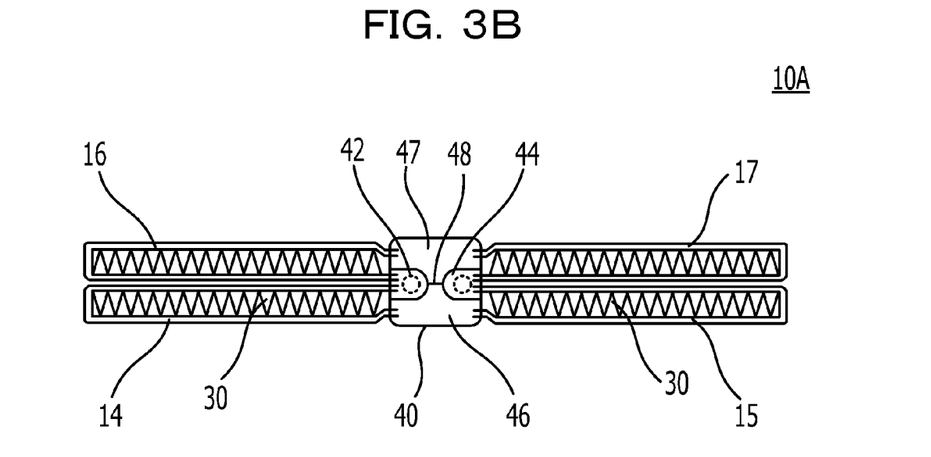

FIG. 3B is a cross-sectional view taken along line B-B' in FIG. 3A. The inside of the tank 40 is divided into the inlet chamber 42 on the middle left side, communicating with the inlet port 43, the discharge chamber 44 on the middle right side, communicating with the discharge port 45, a lower reservoir 46 and an upper reservoir 47 for storing refrigerant. The lower reservoir 46 and the upper reservoir 47 are separated by a partition plate 48.

Figure 4:
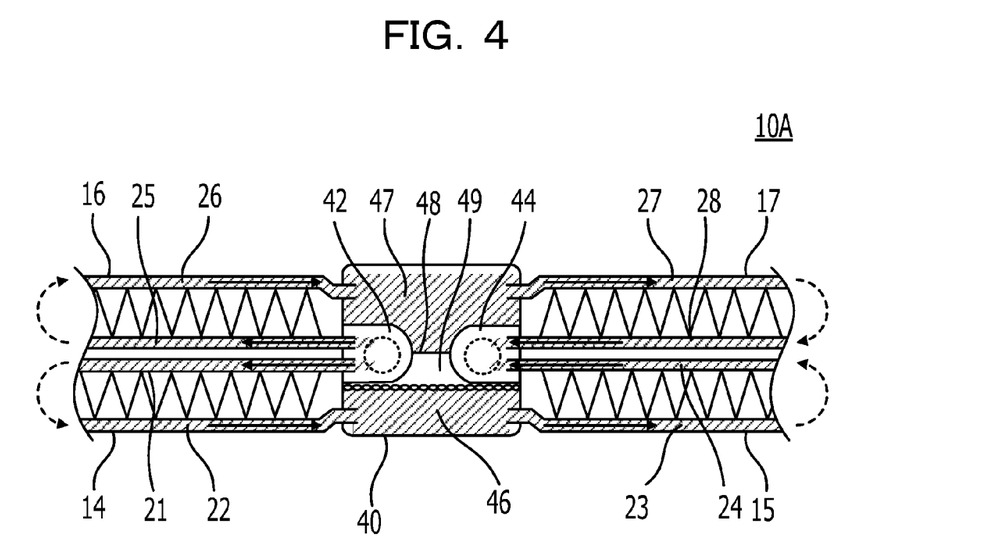
FIG. 4 illustrates a cooling operation of the cooling unit according to the second embodiment.

FIG. 4 illustrates the cooling operation of the cooling unit 10A of the second embodiment. The refrigerant heated by absorbing the heat of the CPUs 90 via the cooling jackets 92 flows into the inlet chamber 42 through the inlet port 43. The heated refrigerant is supplied from the inlet chamber 42 simultaneously to the flow path 21 of the radiator 14 on the lower left side and to the flow path 25 of the radiator 16 thereabove in FIG. 4. The heat of the refrigerant flowing through the flow paths 21 and 25 is conducted to the radiation plates 30 of the radiator, whereby the temperature of the refrigerant decreases. The radiation plates 30 are cooled by the fans 80. The refrigerant flowing through the flow path 21 turns at the end of the flow path 21 and flows back through the flow path 22. The refrigerant flowing through the flow path 25 turns at the end of the flow path 25 and flows back through the flow path 26. The heat of the refrigerant flowing through the flow paths 22 and 26 is conducted again to the radiation plates 30, whereby the temperature of the refrigerant further decreases. The heat of the refrigerant flowing through the flow path 26 is also released from the upper surface of the flow path 26. The refrigerant flowing through the flow path 22 flows into the lower reservoir 46 of the tank 40. The refrigerant flowing through the flow path 26 flows into the upper reservoir 47 of the tank 40.

In addition to the refrigerant flowing through the heat-release circulation loop, the lower reservoir 46 and the upper reservoir 47 store refrigerant for compensating for a decrease in the amount of refrigerant flowing through the heat-release circulation loop due to permeation of the refrigerant through the rubber used in the pipes and the resin surface used in the pump.

The refrigerant flowing into the lower reservoir 46 is supplied to the flow path 23 of the lower radiator 15 on the right side in FIG. 4. The heat of the refrigerant flowing through the flow path 23 is conducted to the radiation plate 30, whereby the temperature of the refrigerant further decreases. The radiation plate 30 is cooled by the fans 80. The refrigerant flowing through the flow path 23 turns at the end of the flow path 23 and flows back through the flow path 24. The heat of the refrigerant flowing through the flow path 24 is conducted again to the radiation plate 30, whereby the temperature of the refrigerant further decreases. The refrigerant flowing through the flow path 24 flows into the discharge chamber 44 in the tank 40.

The refrigerant flowing into the upper reservoir 47 is supplied to a flow path 27 of the radiator 17 on the upper right side in FIG. 4. The heat of the refrigerant flowing through the flow path 27 is conducted to the radiation plate 30, whereby the temperature of the refrigerant further decreases. The radiation plate 30 is cooled by the fans 80. The heat of the refrigerant flowing through the flow path 27 is also released from the upper surface of the flow path 27. The refrigerant flowing through the flow path 27 turns at the end of the flow path 27 and flows back through the flow path 28. The heat of the refrigerant flowing through the flow path 28 is conducted again to the radiation plate 30, whereby the temperature of the refrigerant further decreases. The refrigerant flowing through the flow path 28 flows into the discharge chamber 44 in the tank 40.

The refrigerant flowing into the discharge chamber 44 from the flow paths 24 and 28 is discharged from the discharge port 45 into the pipe 62 and is returned to the pump 82 through the pipe 62. In this manner, the refrigerant heated by the CPUs 90 is gradually cooled in the flow paths 21, 22, 23, 24, 25, 26, 27, and 28 in the cooling unit 10A, and the cooled refrigerant is returned to the pump 82 and is then supplied back by the pump 82 to absorb the heat of the CPUs 90.

In the tank 40, the lower reservoir 46 occupies a region beneath the inlet chamber 42 and the discharge chamber 44 and a lower half region between the inlet chamber 42 and the discharge chamber 44. In the tank 40, the upper reservoir 47 occupies a region above the inlet chamber 42 and the discharge chamber 44 and an upper half region between the inlet chamber 42 and the discharge chamber 44.

When the server module 100 is fabricated, the heat-release circulation loop is filled with the refrigerant as much as possible. The entire lower reservoir 46 and upper reservoir 47 are filled with the refrigerant.

When the server module 100 is activated to start cooling the CPUs 90, the temperature of the refrigerant increases. As a result, the air dissolved in the refrigerant under normal temperature becomes bubbles. The bubbles generated in the heat-release circulation loop move along the refrigerant flow and flow into the lower reservoir 46 in the tank 40. Because the bubbles have less specific gravity than the refrigerant, the bubbles are accumulated in the upper region in the lower reservoir 46, between the inlet chamber 42 and the discharge chamber 44. The bubbles once accumulated in the region between the inlet chamber 42 and the discharge chamber 44 are not discharged into the flow path 23 of the lower right-side radiator 15 and form an air layer 49. Because the air layer 49 is positioned in the upper region of the lower reservoir 46, the air layer 49 does not block the flow of the refrigerant flowing from the lower left-side radiator 14 and to the lower right-side radiator 15 through the lower reservoir 46. Because the bubbles generated in the heat-release circulation loop are eventually collected in the lower reservoir 46, the flow of the refrigerant in the heat-release circulation loop may be prevented from being blocked by the bubbles.

In the tank 40, because the inlet chamber 42 and the discharge chamber 44 are disposed at a distance from each other, the heat of the refrigerant heated by the CPUs 90 and flowing into the inlet chamber 42 may be prevented from being conducted to the refrigerant cooled by the lower right-side radiator 15 and the upper right-side radiator 17 in the discharge chamber 44. Because the air layer 49, serving as a heat insulating layer, is formed between the inlet chamber 42 and the discharge chamber 44, the heat of the refrigerant cooled by the lower radiator 14 may be prevented from being conducted to the refrigerant further cooled by the lower right-side radiator 15 and the upper right-side radiator 17 and flowing into the discharge chamber 44. Thus, the cooling efficiency is improved.

Figure 5:
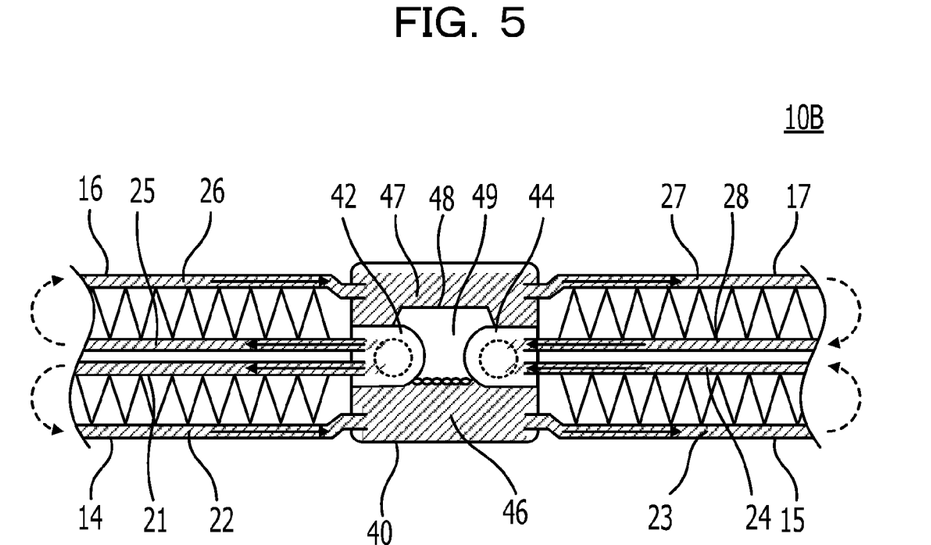
FIG. 5 illustrates a cooling operation of a cooling unit according to a third embodiment.

Next, with reference to FIG. 5, a cooling unit 10B according to a third embodiment will be described. Compared with the cooling unit 10A according to the second embodiment, the cooling unit 10B according to the third embodiment is configured such that the partition plate 48 separating the lower reservoir 46 and the upper reservoir 47 projects further toward the upper reservoir 47. With this structure, more bubbles may be collected, even if air dissolved in the refrigerant at the normal temperature is vaporized owing to an increase in temperature of the refrigerant, generating a large number of bubbles. The collected bubbles form the air layer 49. The air layer 49, serving as a heat insulating layer, prevents the heat of the refrigerant cooled by the upper left-side radiator 16 from being conducted to the refrigerant further cooled by the lower right-side radiator 15 and the upper radiator 17 and flowing into the discharge chamber 44. Thus, the cooling efficiency is improved.

Figure 6:
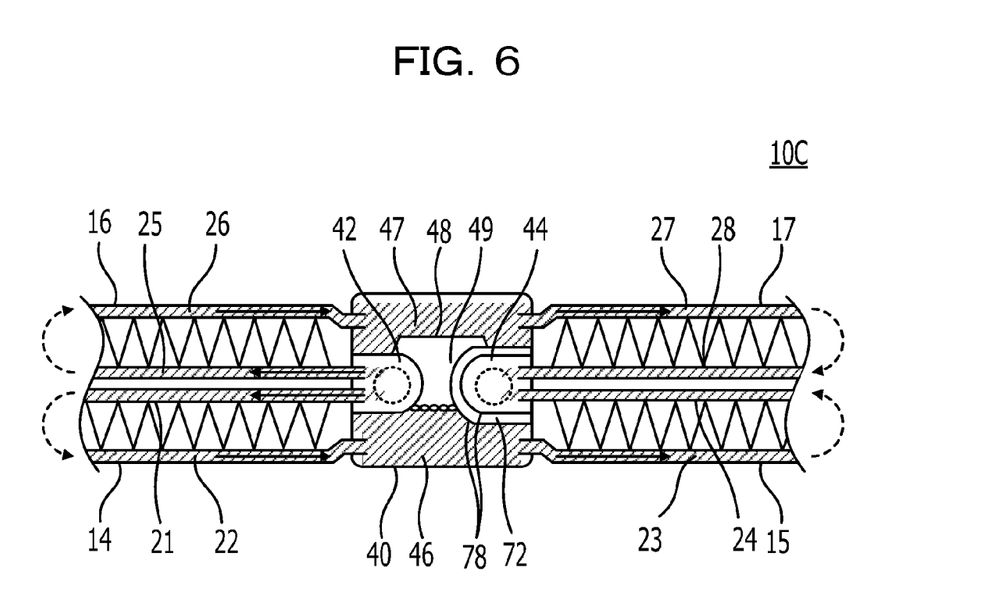
FIG. 6 illustrates a cooling operation of a cooling unit according to a fourth embodiment.

Next, with reference to FIG. 6, a cooling unit 10C according to a fourth embodiment will be described. Compared with the cooling unit 10B according to the third embodiment, the cooling unit 10C according to the fourth embodiment has a double-walled partition plate 78 defining the discharge chamber 44 in the tank 40 on the right side in FIG. 6, and an air layer 72 is provided between the walls of the partition plate 78. This structure prevents the heat of the refrigerant cooled in the lower-left radiator 14 and the upper radiator 16 and flowing in the lower reservoir 46 and the upper reservoir 47 from being conducted to the refrigerant further cooled in the lower right-side radiator 15 and the upper radiator 17 and flowing in the discharge chamber 44.

Figure 7:
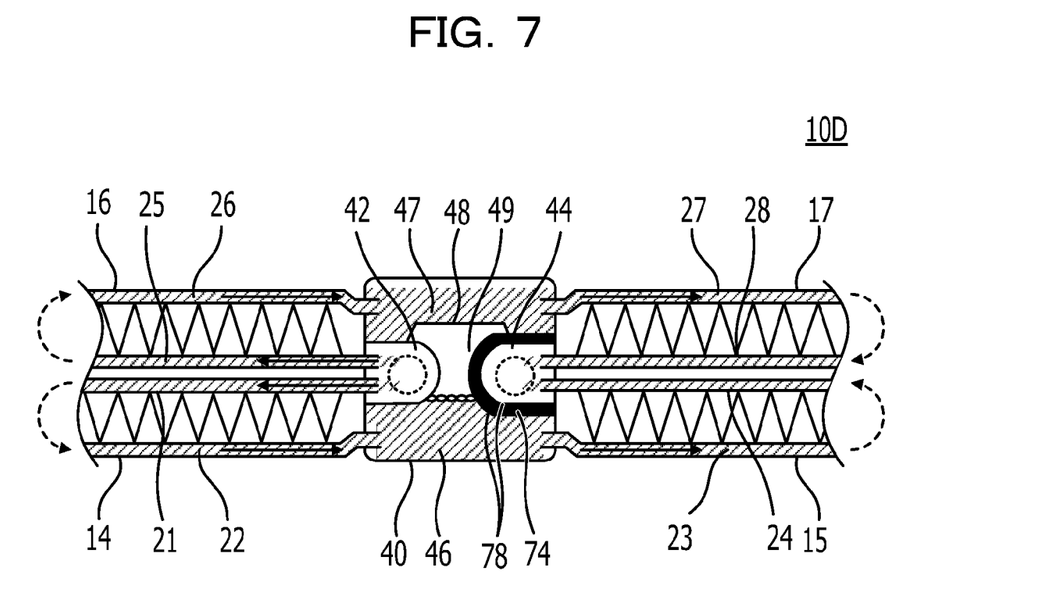
FIG. 7 illustrates a cooling operation of a cooling unit according to a fifth embodiment.

Next, with reference to FIG. 7, a cooling unit 10D according to a fifth embodiment will be described. Compared with the cooling unit 10C according to the fourth embodiment, in the cooling unit 10D according to the fifth embodiment, instead of the air layer 72, a heat insulating layer 74 containing a heat insulating material is provided between the double wall of the partition plate 78 in the discharge chamber 44 in the tank 40 on the right side in FIG. 7. Similarly to the fourth embodiment, this structure prevents the heat of the refrigerant cooled in the lower-left radiator 14 and the upper radiator 16 and flowing in the lower reservoir 46 and the upper reservoir 47 from being conducted to the refrigerant further cooled in the lower right-side radiator 15 and the upper radiator 17 and flowing in the discharge chamber 44.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A cooling unit comprising:
    a tank having an inlet port and a discharge port for a refrigerant;
    first and second radiators coupled to the tank, the first and second radiators each having a flow path;
    third and fourth radiators coupled to the tank, the third and fourth radiators each having flow paths;
    an inlet chamber defined in the tank for supplying the refrigerant flowing therein from the inlet port to the first radiator and the third radiator;
    a discharge chamber defined in the tank for discharging the refrigerant flowing therein from the second radiator and the fourth radiator to the discharge port;
    a first reservoir defined in the tank and arranged below the inlet chamber and the discharge chamber, the refrigerant flowing from the first radiator is stored in the first reservoir and is supplied to the second radiator; and
    a second reservoir defined in the tank and arranged above the inlet chamber and the discharge chamber, the refrigerant flowing from the third radiator is stored in the second reservoir and is supplied to the fourth radiator,
    wherein the first reservoir and the second reservoir are reservoirs in which bubbles generated in the refrigerant are collected, and
    wherein the first radiator and the third radiator are disposed on a first side face of the tank, and the second radiator and the fourth radiator are disposed on a second side face of the tank opposite the first radiator and the first side face.

2. The cooling unit according to claim 1, further comprising
    a heat insulating layer formed around the discharge chamber in the tank.

3. The cooling unit according to claim 2, wherein the heat insulating layer is an air layer.

4. The cooling unit according to claim 2, wherein the heat insulating layer is a heat insulating material.

* * * * *